US006963113B2

(12) United States Patent
Ang et al.

(10) Patent No.: US 6,963,113 B2
(45) Date of Patent: Nov. 8, 2005

(54) METHOD OF BODY CONTACT FOR SOI MOSFET

(75) Inventors: Ting Cheong Ang, Singapore (SG); Sang Yee Loong, Singapore (SG); Shyue Fong Quek, Petaling Jaya (MY); Jun Song, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/915,670

(22) Filed: Aug. 10, 2004

(65) Prior Publication Data

US 2005/0014294 A1 Jan. 20, 2005

Related U.S. Application Data

(62) Division of application No. 09/755,572, filed on Jan. 8, 2001, now Pat. No. 6,787,422.

(51) Int. Cl.[7] ...................... H01L 29/76; H01L 21/336

(52) U.S. Cl. ...................... 257/368; 257/372; 257/374; 257/375; 257/396; 257/397; 438/296; 438/424

(58) Field of Search ................................ 257/368, 372, 257/374, 375, 396, 397; 438/296, 424

(56) References Cited

U.S. PATENT DOCUMENTS

| | | | | |
|---|---|---|---|---|
| 5,504,033 | A | 4/1996 | Bajor et al. | 437/67 |
| 5,591,650 | A | 1/1997 | Hsu et al. | 437/21 |
| 5,674,760 | A | 10/1997 | Hong | 437/24 |
| 5,874,328 | A | 2/1999 | Liu et al. | 438/199 |
| 5,930,605 | A | 7/1999 | Mistry et al. | 438/149 |
| 6,063,652 | A | 5/2000 | Kim | 438/155 |
| 6,406,948 | B1 * | 6/2002 | Jun et al. | 438/152 |
| 6,455,894 | B1 * | 9/2002 | Matsumoto et al. | 257/347 |
| 6,534,378 | B1 * | 3/2003 | Ramkumar et al. | 438/401 |
| 2002/0047155 | A1 * | 4/2002 | Babcock et al. | 257/315 |

OTHER PUBLICATIONS

"Silicon Processing for the VLSI Era", vol. 2, by S. Wolf, Lattice Press, Sunset Beach, CA, c. 1990, pp. 66-67.

* cited by examiner

*Primary Examiner*—Hsien Ming Lee
(74) *Attorney, Agent, or Firm*—George O. Saile; Rosemary L. S. Pike; Stephen B. Ackerman

(57) ABSTRACT

A new method for forming a silicon-on-insulator MOSFET while eliminating floating body effects is described. A silicon-on-insulator substrate is provided comprising a silicon semiconductor substrate underlying an oxide layer underlying a silicon layer. A first trench is etched partially through the silicon layer and not to the underlying oxide layer. Second trenches are etched fully through the silicon layer to the underlying oxide layer wherein the second trenches separate active areas of the semiconductor substrate and wherein one of the first trenches lies within each of the active areas. The first and second trenches are filled with an insulating layer. Gate electrodes and associated source and drain regions are formed in and on the silicon layer in each active area. An interlevel dielectric layer is deposited overlying the gate electrodes. First contacts are opened through the interlevel dielectric layer to the underlying source and drain regions. A second contact opening is made through the interlevel dielectric layer in each of the active regions wherein the second contact opening contacts both the first trench and one of the second trenches. The first and second contact openings are filled with a conducting layer to complete formation of a silicon-on-insulator device in the fabrication of integrated circuits.

14 Claims, 4 Drawing Sheets

METHOD OF BODY CONTACT FOR SOI MOSFET

This is a division of application Ser. No. 09/755,572, filed Jan. 8, 2001, now U.S. Pat. No. 6,787,422.

BACKGROUND OF THE INVENTION

1. Field of the Invention

The present invention relates to the fabrication of integrated circuit devices, and more particularly, to a method of eliminating floating body effects in the fabrication of a silicon-on-insulator (SOI) MOSFET in the fabrication of integrated circuits.

2. Description of the Prior Art

An isolation technology that depends on completely surrounding devices by an insulator is referred to as silicon-on-insulator (SOI) technology. In general, the advantages of SOI technology include simple fabrication sequence, reduced capacitive coupling between circuit elements, and increased packing density. The SOI technology is discussed in *Silicon Processing for the VLSI Era*, Vol. 2, by S. Wolf, Lattice Press, Sunset Beach, Calif., c. 1990, pp. 66–67. A disadvantage of SOI technology is inherent floating body effects due to the limitation in incorporating effective contact to the body. In bulk silicon MOSFETs, the bottom of the bulk silicon can be connected to a fixed potential. However, in an SOI MOSFET, the body is electrically isolated from the bottom of the substrate. The floating body effects result in drain current "kink" effect, abnormal threshold slope, low drain breakdown voltage, drain current transients, and noise overshoot. The "kink" effect originates from impact ionization. When an SOI MOSFET is operated at a large drain-to-source voltage, channel electrons cause impact ionization near the drain end of the channel. Holes build up in the body of the device, raising body potential and thereby raising threshold voltage. This increases the MOSFET current causing a "kink" in the current vs. voltage (I–V) curves. It is desired to eliminate floating body effects.

A number of patents present a variety of isolation methods for silicon-on-insulator and other types of MOSFETs. U.S. Pat. No. 5,504,033 to Bajor et al shows a process for forming both deep and shallow trenches in a SOI device; however, there is no requirement for the trenches to contact the substrate. U.S. Pat. No. 6,063,652 to Kim and U.S. Pat. No. 5,591,650 to Hsu et al show an SOI device having a shallow trench isolation (STI) formed entirely through the silicon to the oxide layer. U.S. Pat. No. 5,874,328 to Liu et al discloses trench isolation through a source/drain region. U.S. Pat. No. 5,674,760 to Hong discloses an isolation structure, but not in SOI technology. U.S. Pat. No. 5,930,605 to Mistry et al discloses a Schottky diode connection between the body and one of the source/drain regions.

SUMMARY OF THE INVENTION

Accordingly, a primary object of the invention is to provide a process for forming a silicon-on-insulator MOSFET in the fabrication of integrated circuits.

A further object of the invention is to provide a process for forming a silicon-on-insulator MOSFET while eliminating floating body effects.

Another object of the invention is to provide a process for forming a silicon-on-insulator MOSFET while eliminating floating body effects by providing contact to the body of the transistor.

In accordance with the objects of the invention, a method for forming a silicon-on-insulator MOSFET while eliminating floating body effects is achieved. A silicon-on-insulator substrate is provided comprising a semiconductor substrate underlying an oxide layer underlying a silicon layer. A first trench is etched into the silicon layer wherein the first trench extends partially through the silicon layer and does not extend to the underlying oxide layer. Second trenches are etched into the silicon layer wherein the second trenches extend fully through the silicon layer to the underlying oxide layer and wherein the second trenches separate active areas of the semiconductor substrate and wherein one of the first trenches lies within each of the active areas. The first and second trenches are filled with an insulating layer. Gate electrodes and associated source and drain regions are formed in and on the silicon layer between the second trenches. An interlevel dielectric layer is deposited overlying the gate electrodes. First contacts are opened through the interlevel dielectric layer to the underlying source and drain regions. In the same step, a second contact opening is made through the interlevel dielectric layer in each of the active regions wherein the second contact opening contacts both the first trench and one of the second trenches. The first and second contact openings are filled with a conducting layer to complete formation of a silicon-on-insulator device in the fabrication of integrated circuits.

Also in accordance with the objects of the invention, a silicon-on-insulator device in an integrated circuit is achieved. The device comprises a silicon layer overlying an oxide layer on a silicon semiconductor substrate. Shallow trench isolation regions extend fully through the silicon layer to the underlying oxide layer wherein the shallow trench isolation regions separate active areas of the semiconductor substrate. A second isolation trench lies within each of the active areas and extends partially through the silicon layer wherein the second isolation trench does not extend to the underlying oxide layer. Gate electrodes and associated source and drain regions lie in and on the silicon layer between the shallow trench isolation regions and covered with an interlevel dielectric layer. First conducting lines extend through the interlevel dielectric layer to the underlying source and drain regions. A second conducting line within each of the active areas extends through the interlevel dielectric layer wherein the second conducting line contacts both the second trench and one of the shallow trench isolation regions.

BRIEF DESCRIPTION OF THE DRAWINGS

In the accompanying drawings forming a material part of this description, there is shown.

DESCRIPTION OF THE PREFERRED EMBODIMENTS

FIGS. 1–7 illustrate a process for making a silicon-on-insulator MOSFET while eliminating floating body effects. It should be understood by those skilled in the art that the present invention should not be limited to the embodiment illustrated herein, but can be applied and extended without exceeding the scope of the invention.

Figure 1:
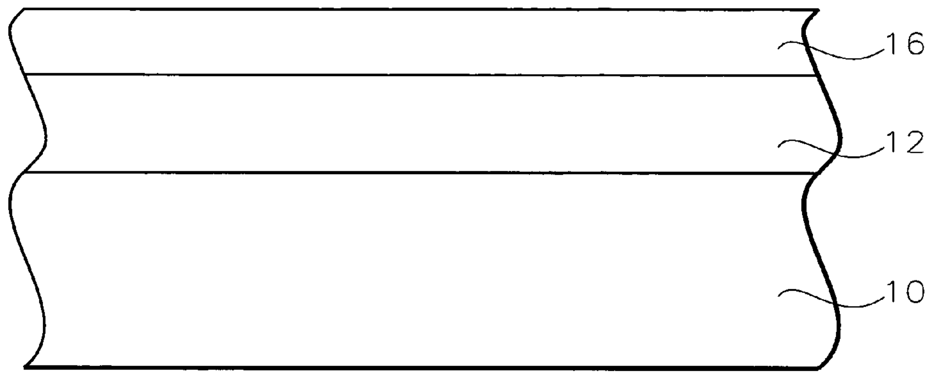
FIGS. 1 through 7 are cross-sectional representations of steps in a process for making a silicon-on-insulator MOSFET according to a preferred embodiment of the present invention.

Referring now more particularly to FIG. 1, there is shown a semiconductor substrate 10. A silicon-on-insulator substrate is fabricated according to any of the conventional methods, such as SIMOX, silicon implant through oxide, or wafer bonding techniques. The resulting SOI substrate comprises a layer of oxide 12 over the silicon substrate 10 having a thickness of between about 200 and 2500 Angstroms. A second silicon layer 16 is epitaxially grown, for example, on the oxide layer 12 to a thickness of between about 500 and 100,000 Angstroms.

Figure 2:
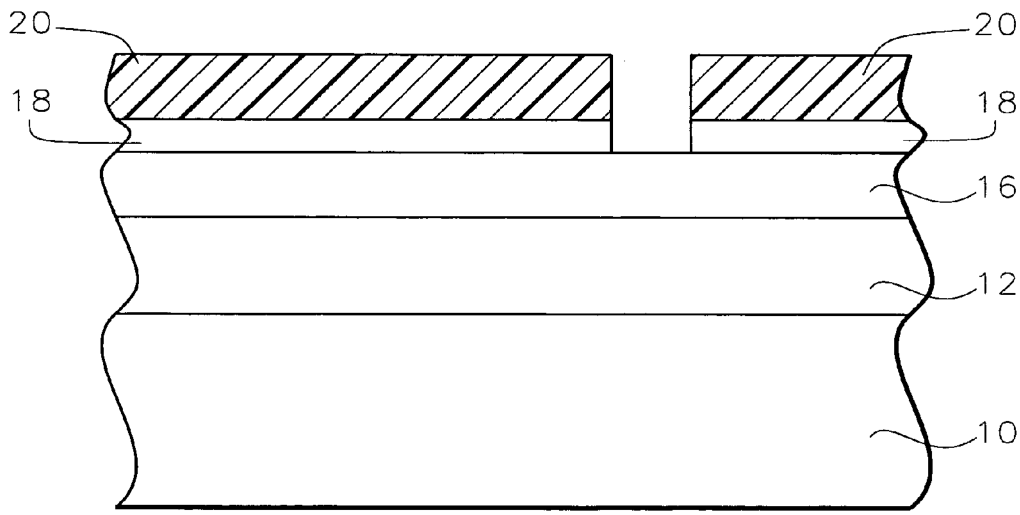

Referring now to FIG. 2, a layer of oxide 18 is deposited over the silicon layer 16 by low pressure chemical vapor deposition (LPCVD) to a thickness of between about 100 and 500 Angstroms. This layer 18 is a stress relief layer. A hard mask layer 20 is formed over the oxide layer 18. This layer is a dielectric, such as silicon nitride. The hard mask layer 20 and stress relief layer 18 are patterned as shown in FIG. 2 for a first shallow trench isolation (STI) trench. The hard mask 20 is used to pattern a first trench 23 which extends partially into the silicon layer 16. The hard mask and stress relief layers 18 and 20 are removed, for example by hydrofluoric acid or chemical etching.

Figure 3:
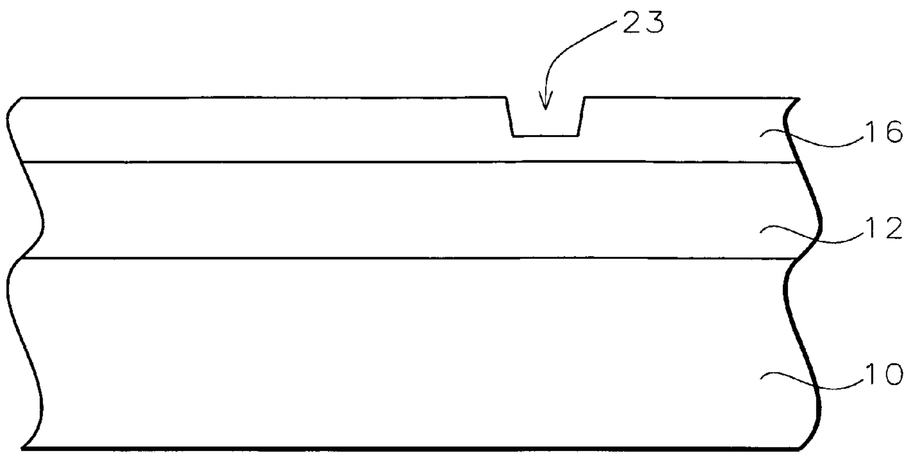

The first trench 23, shown in FIG. 3, is etched to a depth of between about ½ and ¾ of the silicon 16 thickness. This is to insure no degradation of transistor performance. The trench must maintain connection to the silicon substrate 16.

Figure 4:
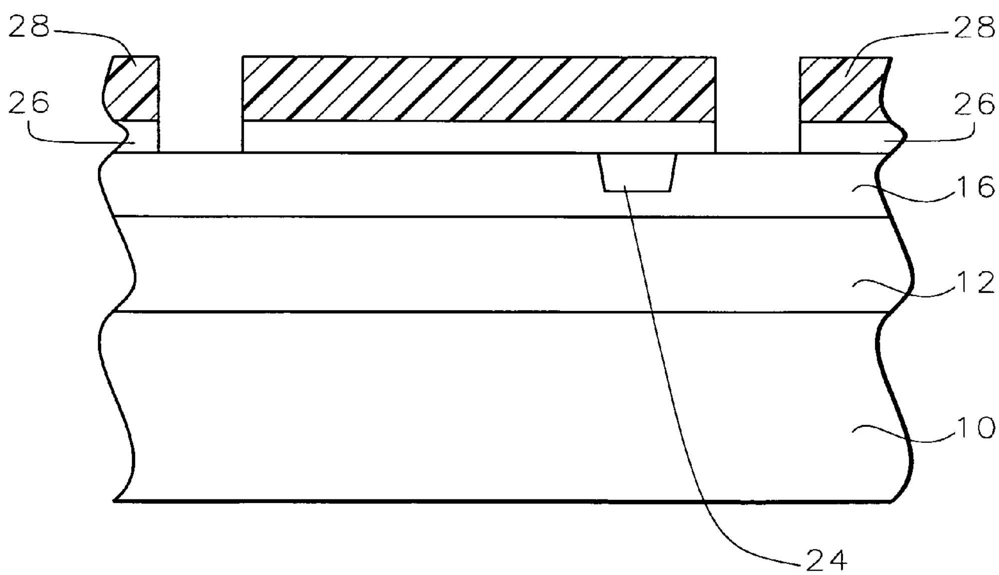

The shallow trench 23 is filled with an oxide layer 24. For example, a liner oxide layer, not shown, first may be grown on the sidewalls and bottom of the shallow trench, such as by LPCVD to a thickness of between about 100 and 500 Angstroms. Then an oxide layer, such as high density plasma (HDP) oxide may be deposited to fill the trench, as shown in FIG. 4.

Figure 5:
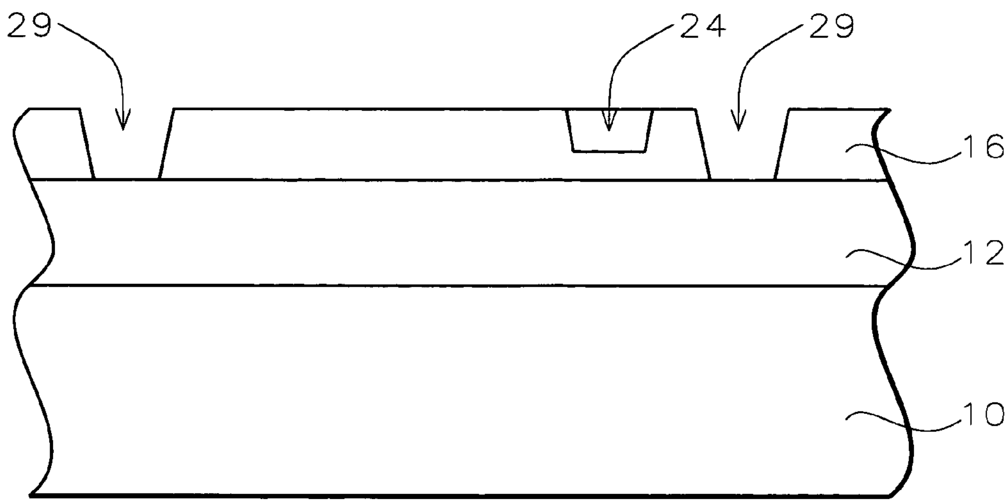

Now, shallow trench isolation regions will be formed to separate active areas. A second stress relief oxide layer 26 is deposited over the silicon layer 16 to a thickness of between about 100 and 500 Angstroms. A second hard mask layer 28 is formed over the oxide layer 24. This layer is a dielectric, such as silicon nitride. The hard mask layer 28 and stress relief layer 26 are patterned as shown in FIG. 4 for second shallow trench isolation (STI) trenches. The hard mask 28 is used to pattern second trenches 29 which extend all the way through the silicon layer 16 to the oxide layer 12, as shown in FIG. 5. The hard mask 28 and stress relief layer 26 are removed.

Figure 6:
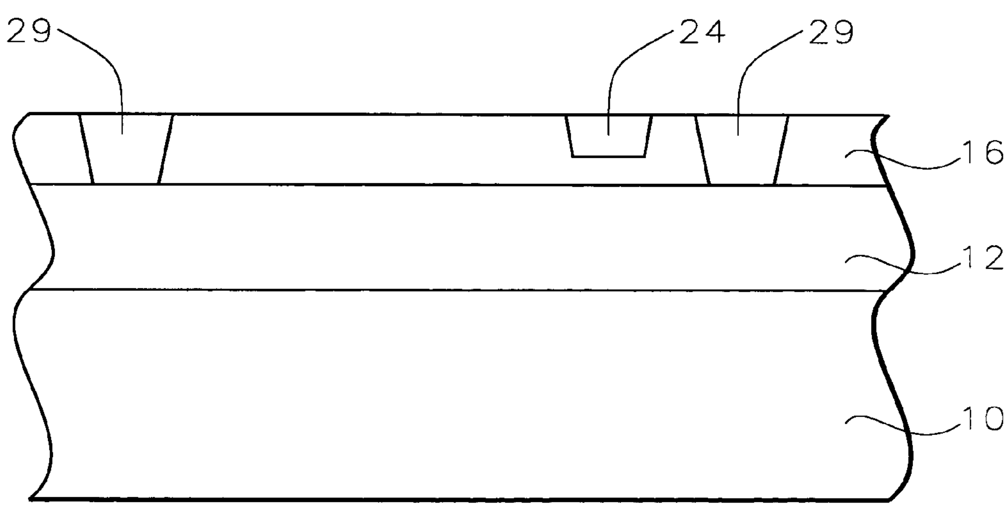

Referring now to FIG. 6, the deep trenches 29 are filled with an insulating layer by any of the conventional fill methods. For example, a liner oxide layer, not shown, first may be grown on the sidewalls and bottom of the shallow trench, such as by LPCVD to a thickness of between about 100 and 500 Angstroms. Then an oxide layer, such as high density plasma (HDP) oxide may be deposited to fill the trenches.

Figure 7:
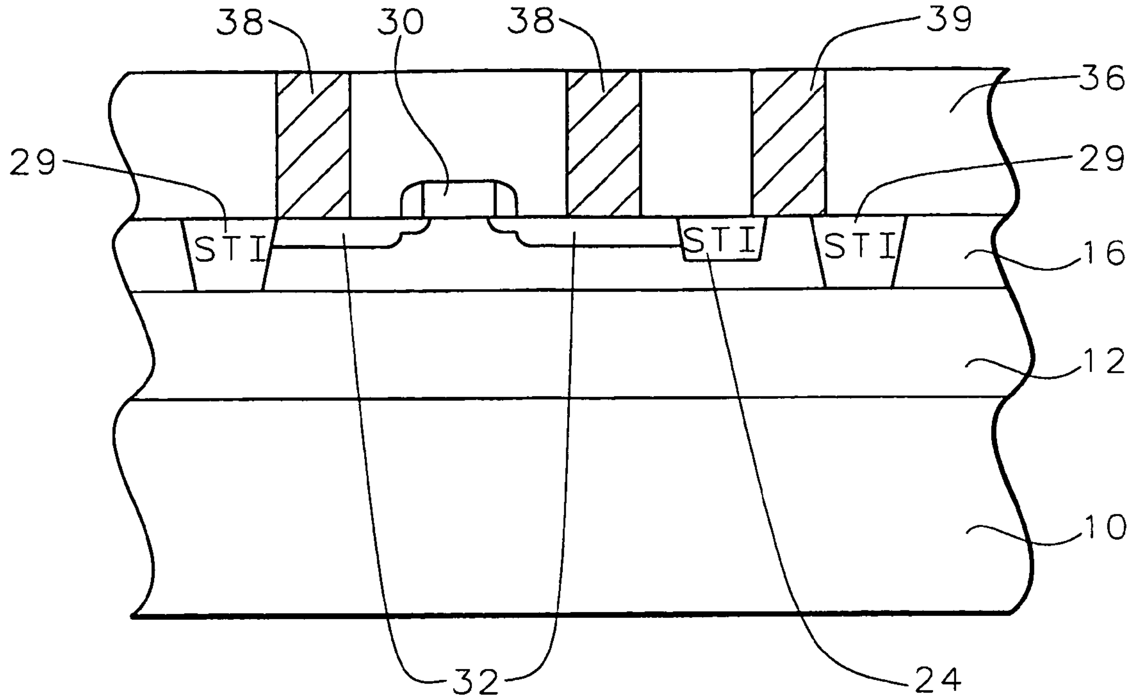

Processing continues to form transistors 30 having associated source and drain regions 32 in and on the silicon layer 16, as illustrated in FIG. 7. An interlevel dielectric layer (ILD) 36 is blanket deposited over the silicon layer and transistors to a thickness of between about 6000 to 20,000 Angstroms. The ILD layer may comprise sub-atmospheric borophosphosilicate glass (BPSG), tetraethoxysilane (TEOS) oxide, fluorinated silicate glass (FSG), and low dielectric constant dielectrics, for example.

Contact openings are etched through the ILD layer 36 to the underlying source/drain regions 32. At the same time, a contact opening is etched through the ILD layer 36 to contact portions of both the shallow trench 23 and a nearby deep trench 29.

A conducting layer, such as tungsten or an aluminum/copper alloy, is deposited over the ILD layer and within the contact openings. The conducting layer may be etched back to leave plugs 38 and 39. The conducting plug 39 contacts both the shallow trench and the deep trench for isolation and to form a large area contact for low contact resistance.

Figure 8:
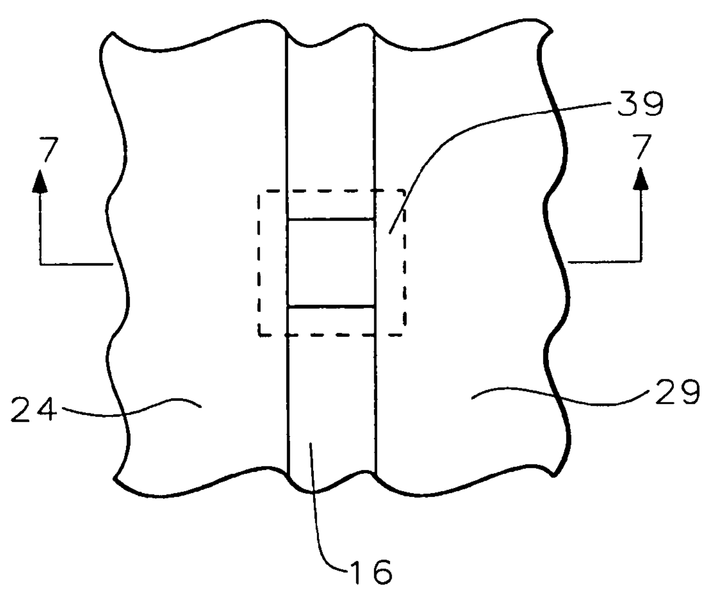
FIG. 8 is a top-view representation of a preferred embodiment of the present invention.

This completes formation of the SOI MOSFET. FIG. 8 illustrates a top view of the device illustrated in FIG. 7. The dotted line indicates the footprint of the contact 39, showing that the contact extends over the shallow trench 24 and the deeper trench 29. In the present invention, the architecture allows for the contact to the substrate to overlap both the shallow and deep trenches. This is because the contact is allowed to have extensions over the two types of trenches with no detrimental effects on device performance. In addition, this design also accommodates for process window considerations. Positive enclosures of the contact over the trenches provides for lower contact resistance and, thus, better contact to the substrate.

The process of the present invention results in the formation a silicon-on-insulator MOSFET having no floating body effects. This is achieved by providing contact to the substrate with minimum loss of silicon real estate for optimum device performance.

FIG. 7 illustrates a silicon-on-insulator device of the present invention. This device avoids floating body effects. The device comprises a silicon layer 16 overlying an oxide layer 12 on a silicon semiconductor substrate 10. Shallow trench isolation regions 29 extend fully through the silicon layer 16 to the underlying oxide layer 12 wherein the shallow trench isolation regions separate active areas of the semiconductor substrate. A second isolation trench 24 lies within each of the active areas and extends partially through the silicon layer 16 wherein the second isolation trench does not extend to the underlying oxide layer 12. This trench provides contact to the silicon substrate. Gate electrodes 30 and associated source and drain regions 32 lie in and on the silicon layer 16 between the shallow trench isolation regions and covered with an interlevel dielectric layer 36. First conducting lines 38 extend through the interlevel dielectric layer to the underlying source and drain regions 32. A second conducting line 39 within each of the active areas extends through the interlevel dielectric layer wherein the second conducting line 39 extends over both the second trench 24 and one of the shallow trench isolation regions 29.

The silicon-on-insulator device of the present invention avoids floating body effects by providing contact to the silicon substrate. Positive enclosures of the contact 39 over both the shallow trench isolation region 29 and the body contact trench 24 provides for lower contact resistance and, thus, better contact to the substrate.

While the invention has been particularly shown and described with reference to the preferred embodiments thereof, it will be understood by those skilled in the art that various changes in form and details may be made without departing from the spirit and scope of the invention.

What is claimed is:

1. A silicon-on-insulator device in an integrated circuit comprising:

a silicon layer overlying an oxide layer on a silicon semiconductor substrate;

shallow trench isolation regions extending fully through said silicon layer to underlying said oxide layer wherein said shallow trench isolation regions separate active areas of said semiconductor substrate;

a second isolation trench lying within each of said active areas and extending partially through said silicon layer wherein said second isolation trench does not extend to underlying said oxide layer;

gate electrodes and associated source and drain regions lying in and on said silicon layer between said shallow trench isolation regions and covered with an interlevel dielectric layer;

first conducting lines through said interlevel dielectric layer to underlying said source and drain regions; and a second conducting line within each of said active areas through said interlevel dielectric layer wherein said second conducting line contacts both said second isolation trench and one of said shallow trench isolation regions.

2. The device according to claim 1 wherein said second isolation trench extends into said silicon layer to a depth of between ½ and ¾ the thickness of said silicon layer.

3. The device according to claim 1 wherein said shallow trench isolation regions and said second isolation trench are filled with an insulating layer comprising a liner oxide layer and a gap-filling oxide layer.

4. The device according to claim 1 wherein said interlevel dielectric layer comprises sub-atmospheric borophosphosilicate glass (BPSG), tetraethoxysilane (TEOS) oxide, fluorinated silicate glass (FSG), or low dielectric constant dielectric materials and has a thickness of between about 6000 and 20,000 Angstroms.

5. The device according to claim 1 wherein said first and second conducting lines comprises one of the group containing tungsten and aluminum-copper alloys.

6. The device according to claim 1 wherein said second conducting line contacting said second isolation trench and said shallow trench isolation region eliminates floating body effects by providing contact to said silicon layer.

7. The device according to claim 1 wherein said second conducting line contacting said second isolation trench and said shallow trench isolation region lowers contact resistance and improves body contact.

8. A silicon-on-insulator device in an integrated circuit comprising:

a silicon layer overlying an oxide layer on a silicon semiconductor substrate;

first shallow trench isolation regions extending fully through said silicon layer to underlying said oxide layer wherein said first shallow trench isolation regions separate active areas of said semiconductor substrate;

a second isolation trench lying within each of said active areas and extending partially through said silicon layer wherein said second isolation trench does not extend to underlying said oxide layer and wherein no implant underlies said second isolation trench;

gate electrodes and associated source and drain regions lying in and on said silicon layer between said first shallow trench isolation regions and covered with an interlevel dielectric layer;

first conducting lines through said interlevel dielectric layer to underlying said source and drain regions; and a second conducting line within each of said active areas through said interlevel dielectric layer wherein said second conducting line contacts both said second isolation trench and one of said first shallow trench isolation regions.

9. The device according to claim 8 wherein said second isolation trench extends into said silicon layer to a depth of between ½ and ¾ the thickness of said silicon layer.

10. The device according to claim 8 wherein said first shallow trench isolation regions and said second isolation trench are filled with an insulating layer comprising a liner oxide layer and a gap-filling oxide layer.

11. The device according to claim 8 wherein said interlevel dielectric layer comprises sub-atmospheric borophosphosilicate glass (BPSG), tetraethoxysilane (TEOS) oxide, fluorinated silicate glass (FSG), or low dielectric constant dielectric materials and has a thickness of between about 6000 and 20,000 Angstroms.

12. The device according to claim 8 wherein said first and second conducting lines comprise one of the group containing tungsten and aluminum-copper alloys.

13. The device according to claim 8 wherein said second conducting line contacting said second isolation trench and said first shallow trench isolation region eliminates floating body effects by providing contact to said silicon layer.

14. The device according to claim 8 wherein said second conducting line contacting said second isolation trench and said first shallow trench isolation region lowers contact resistance and improves body contact.

* * * * *